United States Patent
Durec et al.

[11] Patent Number: 6,137,995
[45] Date of Patent: Oct. 24, 2000

[54] CIRCUIT AND METHOD OF GENERATING A PHASE LOCKED LOOP SIGNAL HAVING AN OFFSET REFERENCE

[75] Inventors: Jeffrey C. Durec; David Kevin Lovelace, both of Chandler, Ariz.

[73] Assignee: Motorola, Inc., Schaumburg, Ill.

[21] Appl. No.: 09/207,869

[22] Filed: Dec. 8, 1998

[51] Int. Cl.[7] .............................. H04L 7/00; H03L 7/06; H04B 1/40

[52] U.S. Cl. .............................. 455/75; 455/23; 455/42; 455/47; 455/75; 455/165.1; 455/180.3; 455/260

[58] Field of Search ............................ 455/75, 69, 85, 455/86, 88, 23, 24, 42, 47, 71, 73, 180.3, 109, 112, 165.1, 260

[56] References Cited

U.S. PATENT DOCUMENTS

| | | | |
|---|---|---|---|
| 3,944,925 | 3/1976 | De Laune | 455/75 |
| 5,019,785 | 5/1991 | Fognini et al. | 331/40 |
| 5,159,631 | 10/1992 | Quan et al. | 455/75 |
| 5,606,731 | 2/1997 | Pace et al. | 455/75 |
| 5,727,019 | 3/1998 | Tatsumi | 455/86 |
| 5,745,843 | 4/1998 | Wetters et al. | 455/75 |
| 5,757,921 | 5/1998 | Okanobu et al. | 455/86 |
| 5,794,119 | 8/1998 | Evans et al. | 455/75 |
| 5,794,131 | 8/1998 | Cairns | 455/73 |

*Primary Examiner*—Lee Nguyen
*Assistant Examiner*—Simon Nguyen
*Attorney, Agent, or Firm*—Anthony M. Martinez; Lanny L. Parker

[57] ABSTRACT

An integrated transceiver circuit (10) includes a single side-band mixer (12) and a phase locked loop (30). The phase locked loop (30) includes a phase detector (32) coupled to a voltage controlled oscillator (36) via a summing circuit (33) and a low pass filter (34). A feedback signal from the voltage controlled oscillator (36) is transferred to the phase detector (32) through a counter (38). Either a phase modulation signal or a frequency modulation signal are inputs of summing circuit (33) and modulate the transmitter carrier signal generated by the voltage controlled oscillator (36). The carrier signal generated at an output terminal (40) of the transmitter tracks the frequency of the local oscillator signal that is supplied at an input terminal of the single side-band mixer (12) in the receiver.

16 Claims, 1 Drawing Sheet

CIRCUIT AND METHOD OF GENERATING A PHASE LOCKED LOOP SIGNAL HAVING AN OFFSET REFERENCE

BACKGROUND OF THE INVENTION

The present invention relates, in general, to integrated circuits and, more particularly, to a circuit and method of generating a phase locked loop signal with an offset reference.

Transceiver circuits are used in a myriad of wireless communication applications such as cordless telephones, pagers, cellular telephones, and global positioning systems. The receiver section of the transceiver circuit typically receives a radio frequency (RF) modulation signal from an antenna in a heterodyne system. The receiver includes a mixer that downconverts the RF signal to a lower intermediate frequency (IF) according to a local oscillator signal. Thus, the incoming modulation signal is frequency shifted and modulated data is recovered in the IF signal.

The transmitter section of the transceiver circuit transmits data by modulating a carrier signal having a different frequency than the signal received by the receiver. The transmit signal should have minimum spurious noise transmissions outside the desired bandwidth. Typically, the transmit signal is derived from a low frequency reference signal using a phase locked loop which allows the precise establishment of the transmit frequency. The low reference frequency necessitates the use of large external capacitors in the loop filter to stabilize the generation of the transmit signal.

Accordingly, it would be advantageous to provide an integrated transceiver circuit that generates a transmitter modulated signal that processes high bandwidth information. It would be a further advantage for the transceiver circuit to reduce circuit complexity, cost, and power.

DETAILED DESCRIPTION OF THE PREFERRED EMBODIMENT

Generally, the present invention of an integrated transceiver circuit processes high bandwidth information with reduced circuit complexity, cost, and power. A single sideband mixer and a phase locked loop create a transceiver circuit that allows the frequency of the generated transmitter carrier signal to track the frequency of the receiver local oscillator signal. A change in the receiver section of the local oscillator signal causes a voltage change in a voltage controlled oscillator of the transmitter section. Thus, changes in the receiver channel frequency generate changes in the transmitter carrier frequency. The operation of the transceiver circuit allows the voltage controlled oscillator to lock with a high reference frequency which reduces the value of the capacitors used in the low pass filter of the phase locked loop. Small capacitance values allow the low pass filter to be fully integrated, and thereby, reducing the pin count and cost of the integrated transceiver circuit.

Figure 1:
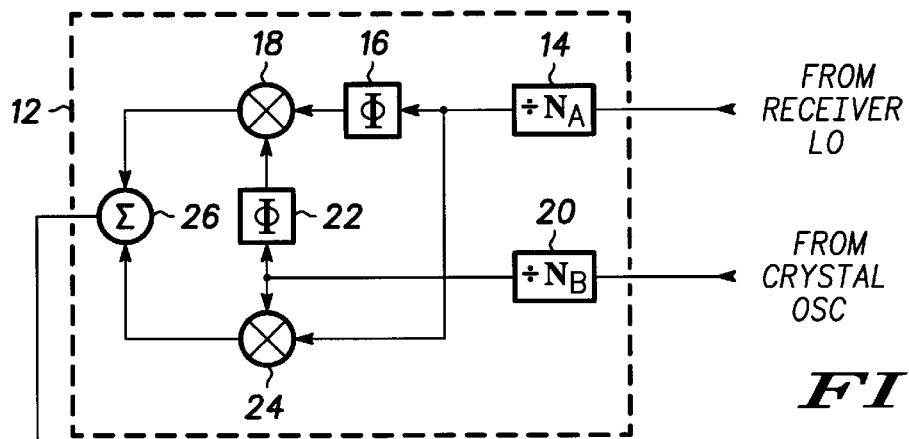
FIG. 1 is a block diagram of a transceiver circuit that illustrates one embodiment of an integrated single side-band mixer and a phase locked loop.

FIG. 1 is a block diagram of a transceiver circuit 10 that illustrates one embodiment of an integrated Single Side-Band (SSB) mixer 12 and a Phase Locked Loop (PLL) 30. SSB mixer 12 has an input coupled for receiving a high frequency signal such as, for example, a 910 Mega Hertz (MHz) signal from a receiver local oscillator. The high frequency signal is converted to a frequency divided signal having a lower frequency by a counter 14. By way of example, when counter 14 is a two stage counter, i.e., $N_A$ equals four, the high frequency signal is reduced in frequency by a factor of four to 227.5 MHz and supplied to a phase shifter 16 and a first input of a mixer 24. An output of phase shifter 16 is connected to a first input of a mixer 18.

Another input of SSB mixer 12 receives a lower frequency signal such as, for example, a 10 MHz signal from a crystal oscillator. The lower frequency signal is converted to a frequency divided signal having a lower frequency by a counter 20 having stages for dividing by $N_B$. By way of example, when $N_B$ equals four, the lower frequency signal is reduced in frequency by a factor of four from 10 MHz to 2.5 MHz and supplied to an input of a phase shifter 22 and a second input of mixer 24. An output of phase shifter 22 is connected to a second input of mixer 18. A summing circuit 26 has first and second inputs connected to respective outputs of mixers 18 and 24.

An output of summing circuit 26 is connected to an input of phase locked loop 30, and in particular, to a first input of a Phase Detector (PD) 32. An output of phase detector 32 is coupled to a Voltage Controlled Oscillator (VCO) 36 via a Low Pass Filter (LPF) 34. A first output of VCO 36 provides an output of phase locked loop 30 at terminal 40. A second output of VCO 36 provides a feedback signal to a second input of phase detector 32 via counter 38. The frequency of the feedback signal is reduced by N, where N is the divide value of a counter 38.

It should be noted that counters 14, 20, and 38 are frequency dividing circuits that reduce the frequency of an incoming signal by respective dividing factors of $N_A$, $N_B$, and N, where the dividing factor is an integer value, although this is not a requirement of the present invention. It should be further noted that a dividing factor for $N_A$, $N_B$, and N of two typically requires a one stage counter, a dividing factor of four requires a two stage counter, and a dividing factor of eight requires a three stage counter, etc.

In operation, SSB mixer 12 receives a 910 MHz signal that is reduced in frequency by counter 14 to a frequency of $f_A$ (227.5 MHz ∠0°). Phase shifter 16 generates an output signal having a frequency of 227.5 MHz that is shifted −90° in phase, i.e., a quadrature component of 227.5 MHz ∠−90°, when compared to the signal at the input of phase shifter 16. Likewise, a 10 MHz signal is reduced in frequency by counter 20 to a frequency of (2.5 MHz ∠0°). Phase shifter 22 generates an output signal having a frequency of 2.5 MHz that is shifted 90° in phase, i.e., a quadrature component of 2.5 MHz ∠90°, when compared to the signal at the input of phase shifter 22.

Mixer 18 receives both a 227.5 MHz ∠−90° signal and a 2,5 MHz ∠90°. Thus, the sum and difference signals generated at the output of mixer 18 have frequencies of 230.0 MHz ∠180° and 225.0 MHz ∠0°, respectively. Mixer 24 receives both a 227.5 MHz ∠0° signal and a 2.5 MHz ∠0°. Thus, the sum and difference signals generated at the output of mixer 24 have frequencies of 230.0 MHz ∠0° and 225.0 MHz ∠0°, respectively. Summing circuit 26 receives the signals generated by mixers 18 and 24. The 230.0 MHz ∠180° signal received from mixer 18 and the 230.0 MHz ∠0° signal received from mixer 24 substantially cancel each other in summing circuit 26. The signal generated at the output of summing circuit 26 has a frequency of 225 MHz.

As described, summing circuit 26 generates the sum of the signals supplied at the two inputs. Alternatively, summing circuit 26 could be used to generate the difference of the signals supplied at the two inputs. In this case, the signal generated at the output of summing circuit 26 would have a frequency of 230 MHz.

Phase detector 32 of phase locked loop 30 receives the 225 MHz signal from SSB mixer 12 along with a feedback signal that is generated by VCO 36. Phase detector 32 compares the phase and frequency of the two input signals and generates an output signal to LPF 34. LPF 34 filters the output signal and generates an analog voltage to VCO 36 that provides stable operation for the frequency of VCO 36. By way of example, when counter 38 has a value for N of four, then VCO 36 generates an output signal having a locked frequency of 225 MHz times N, or 900 MHz.

It should be noted that a change of the local oscillator frequency in the receiver section causes a voltage change in VCO 36 of the transmitter section. Changes in the receiver channel frequency, i.e., the input signal of counter 14, generate changes in the transmitter carrier signal, i.e., the signal at terminal 40 of PLL 30. Thus, transceiver circuit 10 has SSB mixer 12 and PLL 30 that cause the frequency of the generated transmitter carrier signal to track the frequency of the receiver local oscillator signal and differ from the receiver local oscillator signal by a programmable offset frequency. The programmable offset frequency is the value N times $f_B$, where $f_B$ is the frequency of the signal supplied at the output of counter 20 and N is the divide value of counter 38.

Summing circuit 26 has inputs that are typically referred to as positive and negative inputs. It should be noted that transceiver circuit 10 can provide a modulated signal at terminal 40 by switching the signals supplied from mixers 18 and 24 between the positive and negative inputs of summing circuit 26. The modulation of the output signal depends upon the rate at which the signals from mixers 18 and 24 are switched between the positive and negative inputs of summing circuit 26.

Figure 2:
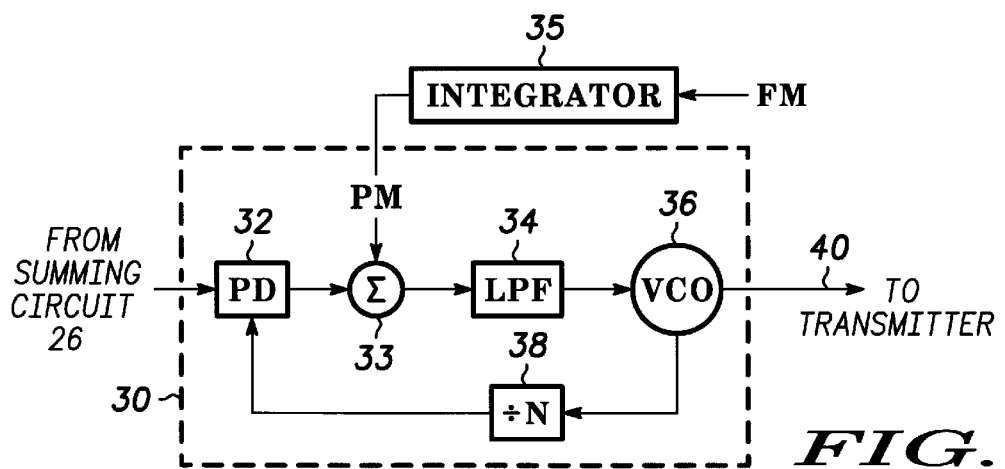
FIG. 2 is a block diagram illustrating another embodiment of the phase locked loop of FIG. 1.

FIG. 2 is a block diagram illustrating another embodiment of phase locked loop 30 of FIG. 1. The same reference numbers are used in the figures to denote the same elements. PLL 30 includes phase detector 32 having a first input connected to the output of summing circuit 26 (see FIG. 1). An output of phase detector 32 is connected to a first input of summing circuit 33. A second input of summing circuit 33 receives a Phase Modulation (PM) signal. It should be noted that the PM signal can be generated by supplying a Frequency Modulation (FM) signal to the input of an integrator 35, and the output of integrator 35 supplies the PM signal to summing circuit 33. The output of summing circuit 33 is coupled to an input of VCO 36 through LPF 34. A first output of VCO 36 is connected to terminal 40 of phase locked loop 30. A second output of VCO 36 provides a feedback signal through counter 38 to a second input of phase detector 32.

In operation, phase detector 32 receives a signal having a frequency such as, for example, 225 MHz ∠0° from summing circuit 26. PLL 30 generates an output signal at terminal 40 having a frequency of (225 MHz ∠θ° times N), where θ is a phase angle. The VCO generated output signal locks at a frequency that is N times higher than the frequency of the signal at the input of phase locked Loop 30, where N is the divide value of counter 38. The phase angle θ of the output signal results from summing the signal at the output of phase detector 32 with the phase modulation signal supplied to summing circuit 33. Thus, the VCO generated signal at terminal 40 is shifted from zero degrees by the amount ∠θ°.

Alternatively, a frequency modulation signal can be supplied to integrator 35. Phase detector 32 of phase locked loop 30 receives a signal having a frequency of 225 MHz from summing circuit 26. Phase locked loop 30 generates an output signal at terminal 40 that alternates between a frequency such as, for example, (225 MHz times N) and ((225 MHz+$f_x$/N) times N), where $f_x$ is the deviation induced by the amplitude of the FM signal at the input of integrator 35 and N is the divide value of counter 38. The rate at which the signal deviates is equal to the frequency of the modulation signal. Thus, the VCO supplies the transmitter with a signal that alternates between two defined frequencies in a specified digital pattern. By way of example, when N has a value of four and $f_x$ has a value of 50 Kilo-Hertz (KHz), the output signal at terminal 40 alternates between 900 MHz and 900.2 MHz at a 50 KHz rate.

By now it should be appreciated that a single side-band mixer and a phase locked loop generate a transmitter carrier signal that tracks the local oscillator carrier frequency of the receiver. A channel frequency change in the receiver section causes a voltage change in the voltage controlled oscillator of the transmitter section. Thus, changes in the receiver channel frequency generate changes in the transmitter carrier frequency. The high operating frequency of the SSB mixer allows the use of relatively small capacitors in the low pass filter associated with the phase lock loop. Small capacitance values allow the Low pass filter to be fully integrated, and thereby, reducing the pin count and cost of the integrated transceiver circuit.

What is claimed is:

1. An integrated transceiver circuit, comprising:
   a single side-band mixer in a receiver section of the integrated transceiver circuit having a first input coupled for receiving a first signal and a second input coupled for receiving a second signal; and
   a phase lock loop in a transmitter section of the integrated transceiver circuit having an input coupled to an output of the single side-band mixer, wherein the phase lock loop supplies an output signal that has a frequency that differs from the first signal by a programmable offset frequency, wherein the phase lock loop further comprises:
   a phase detector having a first input coupled to an output of the single side-band mixer;
   a summing circuit having a first input coupled to an output of the phase detector and a second input coupled for receiving a third signal;
   a low pass filter having an input coupled to an output of the summing circuit;
   a controlled oscillator having an input coupled to an output of the low pass filter; and
   a frequency dividing circuit having an input coupled to an output of the controlled oscillator and an output coupled to a second input of the phase detector.

2. An integrated transceiver circuit, comprising:
   a single side-band mixer in a receiver section of the integrated transceiver circuit having a first input coupled for receiving a first signal and a second input coupled for receiving a second signal; and
   a phase lock loop in a transmitter section of the integrated transceiver circuit having an input coupled to an output of the single side-band mixer, wherein the phase lock loop supplies an output signal that has a frequency that differs from the first signal by a programmable offset frequency, wherein the phase lock loop comprises:

a phase detector having a first input coupled to an output of the single side-band mixer;
  a summing circuit having a first input coupled to an output of the phase detector and a second input coupled for receiving a phase modulation signal;
  a low pass filter having an input coupled to an output of the summing circuit;
  a controlled oscillator having an input coupled to an output of the low pass filter; and
  a frequency dividing circuit having an input coupled to an output of the controlled oscillator and an output coupled to a second input of the phase detector.

3. The integrated transceiver circuit of claim 2, wherein the phase modulation signal is generated by an integrator whose input is a frequency modulation signal.

4. An integrated transceiver circuit, comprising:
  a single side-band mixer having a first input coupled for receiving a first signal and a second input coupled for receiving a second signal;
  a phase detector having a first input coupled to an output of the single side-band mixer;
  a summing circuit having a first input coupled to an output of the phase detector and a second input coupled for receiving a third signal;
  a low pass filter having an input coupled to an output of the summing circuit;
  a controlled oscillator having an input coupled to an output of the low pass filter; and
  a frequency dividing circuit having an input coupled to an output of the controlled oscillator and an output coupled to a second input of the phase detector.

5. The integrated transceiver circuit of claim 4, wherein the second input of the summing circuit receives a phase modulation signal.

6. The integrated transceiver circuit of claim 5, wherein the phase modulation signal is generated by an integrator whose input is the frequency modulation signal.

7. The integrated transceiver circuit of claim 4, wherein the single side-band mixer comprises:
  a first counter having an input for receiving the first signal and an output that supplies a first frequency divided signal; and
  a second counter having an input for receiving the second signal and an output that supplies a second frequency divided signal.

8. The integrated transceiver circuit of claim 7, further comprising:
  a first phase shifter having an input coupled to the output of the first counter;
  a second phase shifter having an input coupled to the output of the second counter;
  a first mixer having a first input coupled to an output of the first phase shifter and a second input coupled to an output of the second phase shifter;
  a second mixer having a first input coupled to the input of the first phase shifter and a second input coupled to the input of the second phase shifter; and
  a summing circuit having first and second inputs coupled to outputs of the respective first and second mixers.

9. A method of generating a transmitter carrier signal that tracks a frequency of a local oscillator signal in a receiver, comprising the steps of:
  generating an output signal having a frequency that is a difference in frequencies of a signal and the local oscillator signal; and
  generating a modulated transmitter signal locked in frequency to the output signal, wherein the modulated transmitter signal is offset in frequency with respect to the local oscillator signal, wherein the step of generating an output signal further comprises the step of generating a first divided signal from the signal and a second divided signal from the local oscillator signal.

10. The method of claim 9, further comprising the steps of generating first and second quadrature components from the first and second divided signals, respectively.

11. The method of claim 10, further comprising the step of mixing the first and second quadrature components to generate first sum and difference signals.

12. The method of claim 10, further comprising the step of mixing the first and second divided signals to generate second sum and difference signals.

13. The method of claim 12, further comprising the step of summing the first and second sum and difference signals to generate the output signal.

14. The method of claim 12, further comprising the step of providing a difference of the first and second sum and difference signals to generate the output signal.

15. The method of claim 12, further comprising the step of alternating between providing a summed output and a difference output of the first and second sum and difference signals to generate a modulated output signal.

16. A transceiver circuit, comprising:
  a single side-band mixer having a first input coupled for receiving a first signal and a second input coupled for receiving a second signal; and
  a phase lock loop having an input coupled to an output of the single side-band mixer and an output for providing an output signal that has a frequency that differs from the first signal by a programmable offset frequency;
  wherein the single side-band mixer comprises:
    a first counter having an input for receiving the first signal and an output that supplies a first frequency divided signal; and
    a second counter having an input for receiving the second signal and an output that supplies a second frequency divided signal.

* * * * *